United States Patent
Mayr-Schmoelzer

(10) Patent No.: US 12,227,829 B2
(45) Date of Patent: Feb. 18, 2025

(54) HIGH-TEMPERATURE COMPONENT

(71) Applicant: PLANSEE SE, Reutte (AT)

(72) Inventor: Bernhard Mayr-Schmoelzer, Reutte (AT)

(73) Assignee: Plansee SE, Reutte (AT)

( * ) Notice: Subject to any disclaimer, the term of this patent is extended or adjusted under 35 U.S.C. 154(b) by 78 days.

(21) Appl. No.: 18/007,173

(22) PCT Filed: Jul. 20, 2021

(86) PCT No.: PCT/AT2021/060254
§ 371 (c)(1),
(2) Date: Jan. 27, 2023

(87) PCT Pub. No.: WO2022/020869
PCT Pub. Date: Feb. 3, 2022

(65) Prior Publication Data
US 2023/0235442 A1    Jul. 27, 2023

(30) Foreign Application Priority Data

Jul. 31, 2020  (AT) .............................. A 50153/2020

(51) Int. Cl.
| | |
|---|---|
| C23C 14/14 | (2006.01) |
| C23C 14/58 | (2006.01) |
| C23C 24/00 | (2006.01) |
| H01J 1/142 | (2006.01) |
| H01J 9/04 | (2006.01) |
| H01J 61/073 | (2006.01) |

(52) U.S. Cl.
CPC .......... *C23C 14/14* (2013.01); *C23C 14/5806* (2013.01); *C23C 24/00* (2013.01); *H01J 1/142* (2013.01); *H01J 9/042* (2013.01); *H01J 61/0735* (2013.01)

(58) Field of Classification Search
None
See application file for complete search history.

(56) References Cited

U.S. PATENT DOCUMENTS

| | | | |
|---|---|---|---|
| 5,705,283 A | 1/1998 | Upadhya | |
| 6,203,752 B1 * | 3/2001 | Bewlay | C03B 37/083 |
| | | | 428/665 |
| 6,211,615 B1 | 4/2001 | Altmann et al. | |
| 6,486,602 B1 | 11/2002 | Setzer | |
| 7,955,715 B2 * | 6/2011 | Trommer | C23C 4/134 |
| | | | 428/665 |

(Continued)

FOREIGN PATENT DOCUMENTS

| | | |
|---|---|---|
| DE | 10132797 A1 | 5/2002 |
| DE | 102009021235 A1 | 11/2010 |

(Continued)

*Primary Examiner* — Daniel J. Schleis
(74) *Attorney, Agent, or Firm* — Laurence A. Greenberg; Werner H. Stemer; Ralph E. Locher

(57) ABSTRACT

A high-temperature component made of a refractory metal or a refractory metal alloy, includes a coating for increasing thermal emissivity. The coating is formed substantially of tungsten and rhenium, i.e. of at least 55 wt. % rhenium and at least 10 wt. % tungsten, and has a Re3W phase of at least 35 wt. %. A process for producing a high-temperature component having a coating for increasing thermal emissivity, is also provided.

14 Claims, 8 Drawing Sheets

(56) References Cited

U.S. PATENT DOCUMENTS

| | | | |
|---|---|---|---|
| 8,710,743 | B2 | 4/2014 | Winzek |
| 11,486,032 | B2 | 11/2022 | Mayr-Schmoelzer et al. |
| 2002/0079842 | A1 | 6/2002 | Ehrlichmann et al. |
| 2007/0178329 | A1* | 8/2007 | Trommer .............. C03B 5/1675 427/404 |

FOREIGN PATENT DOCUMENTS

| | | |
|---|---|---|
| EP | 0917179 A2 | 5/1999 |
| EP | 1019948 B1 | 9/2004 |
| JP | H09231939 A | 9/1997 |
| WO | 0008672 A1 | 2/2000 |
| WO | 2014023414 A1 | 2/2014 |
| WO | 2018204943 A2 | 11/2018 |

\* cited by examiner

HIGH-TEMPERATURE COMPONENT

FIELD AND BACKGROUND OF THE INVENTION

The invention relates to a high-temperature component composed of a refractory metal or a refractory metal alloy and to a process for producing a high-temperature component.

In many components used in high-temperature applications, such as for heating conductors for physical or chemical vapor deposition, electrodes of gas discharge lamps or for rotating X-ray anodes, the heat generated in the component is emitted to the environment by thermal radiation. The energy emitted is proportional here to the thermal emissivity of the radiating surface. This value indicates how much radiation a body emits in relation to an ideal black body. The higher the thermal emissivity of a surface, the more thermal radiation output a body can emit via said surface.

The same applies analogously for the absorption of thermal radiation output: since emissivity and absorptivity of a body are proportional, a body with high thermal emissivity also absorbs more radiation output than a body with lower thermal emissivity.

In the case of technical surfaces over which a heat transfer is to take place by means of radiation, the aim is to achieve the highest possible degree of thermal emission. Due to improved radiation capacity, the same radiation output can be emitted at a lower component temperature. In order to achieve a given radiation output, a component having high thermal emissivity can therefore be operated at a lower operating temperature than a corresponding component having a lower thermal emissivity. Lower component temperatures generally have a positive effect on the service life of the component and on the process stability.

Various approaches for achieving higher thermal emissivity are known from the prior art, one known approach aims at enlarging the microscopic surface of the emission area.

An example of this is WO2014023414 (A1), which describes a heating conductor having a porous sintered coating made of tungsten applied by means of a slurry process. The porous sintered coating composed of tungsten can improve the thermal emissivity in the wavelength range 1700-2500 nm to ca. 0.34; in comparison, the thermal emissivity of a smooth tungsten surface at room temperature in this wavelength range is ca. 0.16.

EP1019948 (B1) describes an anode of a high-pressure gas discharge lamp which is provided with a metallic coating having a dendritic structure. The needle-shaped crystallites of the dendritic structure also increase the surface area of the anode. It should be possible to achieve a thermal emissivity of up to 0.8. However, dendritic structures are very complex and expensive to produce.

A general disadvantage of the aforementioned coating solutions having structures in the lower μm range is the degradation of the coatings with increasing service life. Especially at operating temperatures>1500° C., there is a steady reduction of the surface area due to sintering processes and associated therewith a reduction of the thermal emissivity. Approaches in which the surface is structured on a scale of several 100 μm, for example by means of a laser, so that sintering processes can be avoided, are very cost-intensive.

In addition to the geometric optimization of the surface, work is being done on the further development of suitable coating materials to increase the thermal emissivity.

WO2018204943 (A2) describes a high-temperature component composed of a refractory metal having a coating comprising tantalum nitride and/or zirconium nitride and tungsten with a tungsten content of between 0 and 98% by weight (weight percent). It should be possible to achieve a thermal emissivity of up to 0.8.

DE102009021235 (B4) discloses an electrode for a discharge lamp having a coating in which tungsten particles are embedded in a ceramic matrix layer.

Both coatings mentioned above have in common that they are not suitable for components subject to high thermal stress, such as heating conductors, which are used in coating systems, especially MOCVD systems (metal-organic chemical vapor deposition) and are exposed to temperatures>2000° C. during operation.

US 2002/0079842 (A1) describes an electrode for a high-pressure gas discharge lamp coated with rhenium. Rhenium has a higher thermal emissivity compared to tungsten, but it is very expensive. Tungsten can be added to the applied rhenium for cost reasons. The thermal emissivity of the resulting mixture decreases due to an addition of tungsten compared to pure rhenium.

SUMMARY OF THE INVENTION

The object of the present invention is to further develop high-temperature components and to provide a process for producing the same. The high-temperature component should be characterized by high thermal emissivity and be suitable for operating temperatures around or higher than 2000° C.

The object is achieved by a high-temperature component based on refractory metal or a refractory metal alloy having a coating for increasing thermal emissivity, wherein the coating consists essentially of tungsten and rhenium, that consists of at least 55% by weight rhenium and at least 10% by weight tungsten and the coating has a Re3W phase of at least 35% by weight.

The object is also achieved by a process for producing a high-temperature component having a coating for increasing thermal emissivity, comprising the steps of:

providing a main body of the high-temperature component, i)
coating the main body with tungsten and rhenium via physical vapor deposition using a target material including tungsten and rhenium, wherein the target material includes at least 35% by weight Re3W phase, or ii)
coating the main body with tungsten and rhenium via physical vapor deposition using a target material including tungsten and rhenium, heat treating the coated main body at a heat treatment temperature of at least 500° C. in an inert or reducing atmosphere or high vacuum to form the Re3W phase, cooling the main body to room temperature at a cooling rate of greater than 20 K/min to stabilize the Re3W phase, or iii)
coating the main body with a powder mixture containing rhenium and tungsten with a molar ratio of 25 at. % tungsten to 75 at. % rhenium via a powder metallurgical process, heat treating the coated main body at a heat treatment temperature of at least 500° C. in an inert or reducing atmosphere or high vacuum to form the Re3W phase, cooling the main body to room temperature at a cooling rate of greater than 20 K/min to stabilize the Re3W phase.

Preferred embodiments are specified in the dependent claims.

The applications considered in connection with this application are applications with operating temperatures of typically 1000-2500° C. or more. These include in particular applications in lighting technology (for instance electrodes in high-pressure discharge lamps), furnace technology (for instance heating conductors, internal furnace fittings, charging equipment, crucibles) and medical technology (for instance rotating X-ray anodes).

The components with high operating temperatures involved are referred to in the context of this application as high-temperature components.

Refractory metals or refractory metal alloys are generally used for the high-temperature applications mentioned. In the context of the present application, refractory metals are understood to be the metals of group 4 (titanium, zirconium and hafnium), group 5 (vanadium, niobium, tantalum) and group 6 (chromium, molybdenum, tungsten) of the periodic table of the elements and also rhenium. Refractory metal alloys are alloys having at least 50 at. % (atom percent) of the element in question. Among the properties of these materials are that they have outstanding dimensional stability at high working temperatures. The high-temperature component is based on refractory metal or a refractory metal alloy. This indicates that the high-temperature component consists essentially, i.e. to an extent of at least 50 at. %, preferably to an extent of greater than 95 at. % of refractory metal. The high-temperature component particularly preferably consists entirely of refractory metal or refractory metal alloy and also the usual impurities. Attachments may be connected to the actual high-temperature component. The high-temperature component may be part of a composite component, for example.

A material that is particularly preferred for the high-temperature component due to its heat resistance is tungsten or a tungsten alloy.

A generic high-temperature component has a coating for increasing the thermal emissivity. In this case, the coating may be applied to the entire component or only to parts thereof.

According to the invention, the coating for increasing the thermal emissivity essentially consists of tungsten and rhenium, the proportion of rhenium being at least 55% by weight and the proportion of tungsten being at least 10% by weight (limit values included). In other words, the proportion of rhenium is therefore between 55% by weight and 90% by weight, the remainder being tungsten; the proportion of rhenium is preferably between 60% by weight and 85% by weight, the proportion of rhenium is particularly preferably between 65 and 80% by weight.

"Essentially" here means that the main components are tungsten and rhenium. The coating may comprise small amounts of other constituents and customary impurities. Oxides, nitrides or carbides, and also metals such as molybdenum, iron, copper, tantalum and niobium may be present as impurities. However, the proportion of the main constituents tungsten and rhenium is preferably more than 95% by weight, in particular more than 98% by weight.

According to the invention, tungsten and rhenium in the coating are at least partially in the form of a cubic $Re_3W$ phase, i.e. the coating has a cubic $Re_3W$ phase of at least 35% by weight, in particular at least 40% by weight, particularly preferably at least 50% by weight, especially preferably at least 70% by weight.

$Re_3W$ is an intermetallic phase with a cubic crystal system and, apart from the lattice constant, equivalent to the cubic $Re_{0.75}W_{0.25}$ phase. In the context of the present invention, the $Re_3W$ phase is also understood to be the cubic $Re_{0.75}W_{0.25}$ phase.

The different phases in the tungsten-rhenium binary phase diagram can be seen in FIG. 1. Phases in which the material is in solid solution form are bracketed, phases without brackets are intermetallic phases. In contrast to solid solutions, these show lattice structures that differ from those of the constituent metals and in which there is a mixed bond between the individual metal atoms consisting of a metallic bond component and lower atomic bond or ionic bond components. The $Re_3W$ phase (or $Re_{0.75}W_{0.25}$ phase) is denoted by $\chi$ in the phase diagram.

Surprisingly, it turns out that in the presence of a minimum amount of $Re_3W$ phase, the thermal emissivity is significantly increased. The thermal emissivity of tungsten with a smooth surface is ca. 0.16 at room temperature in the wavelength range 1700-2500 nm, the corresponding thermal emissivity of rhenium is ca. 0.18. The person skilled in the art would therefore expect—cf. also in this regard US200200779842 (A1)—that the thermal emissivity decreases with a decreasing proportion of rhenium. Surprisingly, however, this is not the case. The thermal emissivity for rhenium concentrations in the claimed range between 55 and 90% by weight rhenium is significantly greater than the value that would be expected for this rhenium concentration from a linear interpolation between the thermal emissivity of tungsten and rhenium. If a very high proportion of $Re_3W$ phase is present, a thermal emissivity can be achieved for certain rhenium concentrations that is even greater than that of pure rhenium, i.e. a value greater than 0.18. In the tests by the applicant, the maximum for the thermal emissivity was achieved between about 70 and 80% by weight rhenium.

For the quantitative phase analysis, a representative sample is taken from the coating, ground to a powder, and the powder obtained is analyzed by XRD (X-ray diffraction).

The applicant suspects that the particular properties with respect to thermal emissivity are due to the phonon spectrum of the intermetallic $Re_3W$ phase.

The thermal emissivity, which is due to the material properties of the coating, can be additionally increased by measures to enlarge the microscopic surface area.

The coating is preferably formed as porous. What is meant by porous here is that the coating has a considerable pore content of for example over 5%. The proportion of pores is understood here to be the fractional area of the pores in a total cross-sectional area and is determined based on a representative cross-sectional area of a coating sample. The pores present in the volume of the coating increase the surface area of the coating in comparison with the purely geometric surface, whereby the thermal emissivity is additionally increased. A porous coating can be produced, for example, by means of powder metallurgy methods.

Alternatively, the surface of the high-temperature component to which the coating is applied can already be enlarged compared to the purely geometric surface. In this variant, the surface of the high-temperature component underneath the coating is thus structured and is therefore enlarged. The structuring can be effected by a mechanical, chemical or thermal process. The coating itself is not necessarily porous in this case. The pretreatment of the surface of the high-temperature component is particularly of interest for PVD coating processes (physical vapor deposition).

According to a preferred embodiment, the coating is formed as a sintered layer. A sintered layer is understood to mean a layer that is obtained by a powder-metallurgical coating method. A slurry coating may be mentioned as an example of a powder-metallurgical coating method. After the actual application of the coating substance in the form of particles, the layered application is consolidated by sintering. A sintered layer is generally porous and has a rough surface.

The coating can also be in the form of a PVD layer. In this case, the coating is created on the surface of the high-temperature component by a suitable sputter target in a physical vapor deposition process. A PVD layer is generally smooth and dense and therefore has no pores. In order to increase the surface area, the surface of the high-temperature component may be structured before coating using a mechanical, chemical or thermal process.

PVD and sintered layers can be easily distinguished on account of the very different surface finishes.

By virtue of the production, a sintered layer preferably has a thickness between 2 µm and 300 µm, more preferably between 3 µm and 100 µm, particularly preferably between 5 µm and 50 µm.

In the case of PVD layers, the thickness may also be significantly smaller. Typical thicknesses of PVD layers are between 10 nm and 4 µm.

The thickness of the coating is not decisive for its function.

The coating is preferably formed on the outer side of the high-temperature component. This means that the coating forms the outermost layer on the surface of the high-temperature component. In one use of the high-temperature component, this layer is intended to take part in heat transfer by means of radiation.

Further layers may be present therebelow.

According to one preferred exemplary embodiment, the high-temperature component is formed as a heating conductor. In the context of this application, what is meant by heating conductors are metallic resistance heaters as used in heat-treatment installations. Heating conductors may be formed from sheet metal, bar material, twisted wire, bundled wire or from wire mesh. In the case of planar heating conductors, that is to say heating conductors the basic form of which derives from a sheet metal, it may be desired to provide the coating solely on that side of the heating conductor that faces a furnace interior during operation of the heating conductor.

When used on a heating conductor, the coating has the effect that this can produce a specified heating output at a lower temperature due to the improved heat radiation. A lower operating temperature of the heating conductor is advantageous in terms of service life, since it can reduce creep of the material, for example.

The advantageous coating is of particular interest for heating conductors that are used in coating systems, in particular MOCVD systems. Due to the high operating temperatures of >2000° C., there is the risk of evaporation of the heating conductor material and associated therewith the risk of possible contamination during the coating process. According to the current prior art, these heating conductors are made of either tungsten or rhenium, with the heating conductors that are subjected to the highest thermal stress being made of rhenium. Both materials have a low vapor pressure at high temperatures, but differ in the thermomechanical properties. For this reason, the more expensive rhenium is preferred to the less expensive tungsten for certain applications. The coating according to the invention can increase the thermal emissivity of a tungsten heating conductor to such an extent and can thus reduce the surface temperature to such an extent that the field of application can be significantly expanded. A tungsten heating conductor coated with rhenium and tungsten according to the present invention is an economically very attractive alternative to a heating conductor which is produced entirely of rhenium and which is correspondingly expensive. Due to the comparatively high thermal emissivity, it can be operated at a comparatively lower temperature for a given heating output.

Analogously, it is conceivable that in certain applications the invention allows substitution of a tungsten heating conductor by a heating conductor based on molybdenum and coated with rhenium and tungsten in accordance with the present invention.

Of course it is also possible, especially for applications with particularly high temperatures, to provide a rhenium heating conductor with the coating comprising the $Re_3W$ phase in order thus to increase the thermal emissivity.

Discussed here for heating conductors, the suggestions regarding the substrates also apply to other high-temperature components.

According to another exemplary embodiment, the high-temperature component is designed as an electrode of a high-pressure discharge lamp, in particular as an anode of a high-pressure discharge lamp. Due to the coating of the electrode according to the invention, in particular the anode, this can radiate more heat during operation, which leads to a reduced component temperature and has an advantageous effect on the service life.

According to another exemplary embodiment, the high-temperature component is formed as a crucible. Crucibles of refractory metal are used for example to melt aluminum oxide in the production of single-crystal sapphires. For this purpose, the crucibles are placed in a high-temperature furnace and warmed there by radiant heat from heating conductors. The heat transfer predominantly takes place via the lateral surfaces of the crucible, which absorb the radiant heat and transmit it to the product to be melted. The coating according to the invention couples a greater proportion of the heat given off by heating conductors into the crucible.

The thermal emissivity of the coating is preferably $\varepsilon > 0.6$, measured at room temperature and for a wavelength range between 1700-2500 nm, as explained in more detail below.

The invention also relates to a process for producing a high-temperature component. According to the invention, the process for producing a high-temperature component comprises the steps of:

providing a main body of the high-temperature component, and then i)
  optionally increasing a surface area of the main body of the high-temperature component,
  coating the main body with tungsten and rhenium via physical vapor deposition using a target material comprising tungsten and rhenium, the target material comprising to an extent of at least 35% by weight $Re_3W$ phase or ii)
  optionally increasing a surface area of the main body of the high-temperature component,
  coating the main body with tungsten and rhenium via physical vapor deposition using a target material comprising tungsten and rhenium, heat treating the coated main body at a heat treatment temperature of at least 500° C., preferably at least 1000° C., more preferably above 1800° C. in an inert or reducing atmosphere or high vacuum to form the $Re_3W$ phase, optionally slow cooling of the coated and heat-treated main body from the heat treatment temperature to 800° C., rapid cooling of the main body to room temperature at a cooling rate of greater than 20 K/min to stabilize the $Re_3W$ phase, or iii)

coating the main body with a powder mixture containing rhenium and tungsten with a molar ratio of 25 at. % tungsten to 75 at. % rhenium via a powder metallurgical process, heat treating the coated main body at a heat treatment temperature of at least 500° C., preferably at least 1000° C., more preferably above 1800° C. in an inert or reducing atmosphere or high vacuum to form the $Re_3W$ phase, optionally slow cooling the coated and heat-treated main body from the heat treatment temperature to 800° C., rapid cooling of the main body to room temperature at a cooling rate of greater than 20 K/min to stabilize the $Re_3W$ phase.

The main body is understood to mean the high-temperature component or the semifinished product from which the component is produced, prior to coating.

Three different process variants are therefore proposed, process variant i) and ii) are based on a PVD process, process variant iii) is based on a powder-metallurgical process.

According to the process variants i) and ii), first a surface of the main body of the high-temperature component is preferably pretreated such that the surface area is increased in comparison with the geometric surface. This "roughening" can be done by removing material from the surface, for example by structuring the surface by a mechanical process, e.g. (sand) blasting, chemical (e.g. etching or pickling) or thermal process (e.g. laser structuring).

Alternatively or additionally, the surface area may also be enlarged by a slurry coating. In the case of a slurry method, powdered constituents are suspended in a liquid. Components (here the main body of a high-temperature component) may be coated with the suspension obtained, which generally also contains binders, by dipping, spraying or by brush or the like. After drying, the coating is generally sintered. The coating formed in this way is generally porous and rough. It forms a favorable base for a subsequent coating. The slurry coating may for example be based on tungsten powder.

Subsequently, according to method variant i), tungsten and rhenium are applied to the main body—optionally with an enlarged surface—by means of physical vapor deposition. Target material containing tungsten and rhenium and having the appropriate composition can be used as the source, where the desired $Re_3W$ phase is already present in sufficient quantity in the target material. The preferred rhenium content in the layer can be set by suitably selecting the target composition. In addition to this target material, in which a sufficient amount of $Re_3W$ phase is already present and the composition of which corresponds to the desired tungsten-rhenium content in the layer to be deposited, alternatively two or more target materials can also be used, whereby one predominantly or exclusively consists only of $Re_3W$ phase and one or more additional target materials composed of tungsten and/or rhenium with an appropriate tungsten-rhenium composition are provided to adjust the desired tungsten-rhenium concentration.

Preferably, the target material has to an extent of at least 35% by weight of the cubic $Re_3W$ phase. More preferably, the proportion of $Re_3W$ phase is at least 40% by weight, particularly preferably at least 50% by weight, especially preferably at least 70% by weight.

As a result, the PVD coating has a rhenium content of between 55% by weight and 90% by weight, the remainder tungsten, where the proportion of $Re_3W$ phase is at least 35% by weight.

This process variant i) (PVD coating with $Re_3W$ phase) can be advantageous if the distortion of components with narrow component tolerances is to be avoided. The PVD coating specifically takes place at comparatively low temperatures and does not require any heat treatment of the coating.

Process variant ii) is also a PVD coating process and differs from variant i) in that a $Re_3W$ phase is not necessarily present in the target material, but the $Re_3W$ phase is only formed subsequently by heat treatment in the sputtered layer. For this purpose, the main body coated by a physical vapor deposition process is subjected to annealing at a heat treatment temperature which is in the phase field of $Re_3W$ phase. The heat treatment temperature is at least 500° C., technologically preferably at least 1000° C., more preferably above 1800° C. The duration of the heat treatment depends on the level of the heat treatment temperature.

At temperatures below 1000° C., the formation of the desired phase takes place very slowly due to insufficient kinetics, which makes such a heat treatment temperature less interesting from a technological point of view.

Good results were able to be achieved at a heat treatment temperature of around 1800° C. and a holding time of 20 hours. Other suitable combinations of heat treatment temperature and holding time are accessible to those skilled in the art by experiments.

The stipulation when choosing the heat treatment parameters is to achieve a $Re_3W$ phase content in the coating of at least 35% by weight as a result of the heat treatment.

In particular, the heat treatment should achieve a $Re_3W$ phase content in the coating of at least 40% by weight, particularly preferably at least 50% by weight, especially preferably at least 70% by weight.

An inert atmosphere is provided by inert gases such as nitrogen or argon at a pressure of about 1 bar, and a reducing atmosphere by hydrogen, for example. A high vacuum is understood to mean a vacuum at a pressure of $10^{-3}$-$10^{-8}$ mbar. The heat treatment converts the tungsten and rhenium in the sputtered layer at least partially to an intermetallic $Re_3W$ phase.

After the heat treatment, the coated main body is preferably slowly cooled from the heat treatment temperature to ca. 800° C. and rapidly cooled to room temperature from ca. 800° C. The slow cooling to a temperature below the heat treatment temperature but still in the phase field of the $Re_3W$ phase can be technologically advantageous in order to protect the heat treatment system used.

However, it is also equally possible to rapidly cool directly from the heat treatment temperature to room temperature.

Rapid cooling kinetically stabilizes the $Re_3W$ phase, which is metastable at room temperature.

In the context of this application, slow cooling means cooling on a time scale of a few hours, corresponding to cooling rates between 1 K/min and 10 K/min, typically below 10 K/min.

In the context of this application, rapid cooling means quenching at cooling rates in the range of typically 20 to 150 K/min, preferably greater than 25 K/min, more preferably greater than 50 K/min, particularly preferably greater than 100 K/min.

$Re_3W$ is a metastable phase below ca. 500° C. and is kinetically stabilized by rapid cooling. Process variant ii) has the advantage over process variant i) that no $Re_3W$-containing target material is required (but of course a target material that already comprises $Re_3W$ may be used). The disadvantage is the additionally required heat treatment step at comparatively high temperatures.

According to process variant iii), the main body is initially coated first with a powder mixture containing rhenium and tungsten (molar ratio of tungsten to rhenium around 1:3) using a powder metallurgical process and then—analogously to process variant ii)—subjected to heat treatment (i.e. annealing to form the $Re_3W$ phase, rapid cooling to stabilize the $Re_3W$ phase).

Rhenium or tungsten-containing means here that the powder contains rhenium or tungsten in metallic form. In addition to the two metals, the powder mixture can also comprise other components such as binders. The powder metallurgical process can in particular be a slurry process. The heat treatment consolidates the powder-metallurgically applied layer and, due to the comparatively long process duration of ca. 20 h for a sintering process (as a suitable holding time for the example of a heat treatment temperature of around 1800° C.), part of the tungsten-rhenium particles, which would be in a solid solution form with process durations of 3-10 h normally used with these metals, is converted to the intermetallic $Re_3W$ phase. After the heat treatment, the coated main body is optionally slowly cooled to 800° C. and then rapidly cooled to room temperature. The parameters of the heat treatment and cooling correspond to the parameters in process variant ii). Rapid cooling kinetically stabilises the $Re_3W$ phase, which is metastable at room temperature.

This process variant (powder metallurgical coating) has advantages in terms of costs compared to classic PVD processes. In addition, the layer thickness achieved of the $Re_3W$ phase is generally higher, which has a positive effect on the long-term stability of the coating.

The invention is elucidated in more detail below with reference to following production examples and drawings.

DETAILED DESCRIPTION OF THE INVENTION

Production Example I

To produce the high-temperature component according to production example I, main bodies composed of tungsten were coated with slurries of different powder mixtures. For this purpose, first tungsten powder and/or rhenium powder were weighed out into a binder of 2% by weight ethyl cellulose in ethanol to a total solids content of 50%. Stirring took place at 1500 rpm for 15 minutes with a Multimaster apparatus from Netzsch.

Samples were prepared for the following layer compositions:
- 100% by weight tungsten
- 10% by weight rhenium, remainder tungsten
- 20% by weight rhenium, remainder tungsten
- 30% by weight rhenium, remainder tungsten
- 40% by weight rhenium, remainder tungsten
- 50% by weight rhenium, remainder tungsten
- 60% by weight rhenium, remainder tungsten
- 70% by weight rhenium, remainder tungsten
- 80% by weight rhenium, remainder tungsten
- 90% by weight rhenium, remainder tungsten
- 100% by weight rhenium.

The weight percentages given here refer to the weight of the solid components rhenium and tungsten and also correspond to the weight percentages in the layer, since the organic constituents volatilize during the heat treatment.

Spray coating was then effected manually on tungsten platelets at a distance of ca. 20 cm so as to give a target layer mass of 15 mg/cm². Drying took place in ambient air.

The dried-on layer was then subjected to a heat treatment (annealing). Organic components (e.g. binders) volatilize as a result of the heat treatment and the layer is consolidated. Each heat treatment was conducted at 1800° C. for 20 hours under an argon (Ar) atmosphere. After the heat treatment, the coated main body is slowly cooled stepwise over a period of 10 hours to 800° C. (corresponding to an average cooling rate of 1.67 K/min) and quenched from ca. 800° C. within 20 minutes to room temperature (corresponding to an average cooling rate of around 40 K/min).

For comparison purposes, additional samples of 80% by weight rhenium, remainder tungsten, were produced analogously to the production process described previously, except that they were heat treated for 6 hours at 1600° C. under an argon atmosphere rather than for 20 hours.

The thermal emissivity of the layers was measured using a Solar 410 Reflectometer from Surface Optics Corporation at room temperature and at a wavelength range between 1700-2500 nm, since this infrared wavelength range is particularly relevant for assessing the thermal radiation of a body.

In the tables below, the measurement results are also contrasted with known values of the thermal emissivity of coatings known from the prior art, for example coatings with tantalum nitride according to WO2018204943 (A2).

Figure 1:
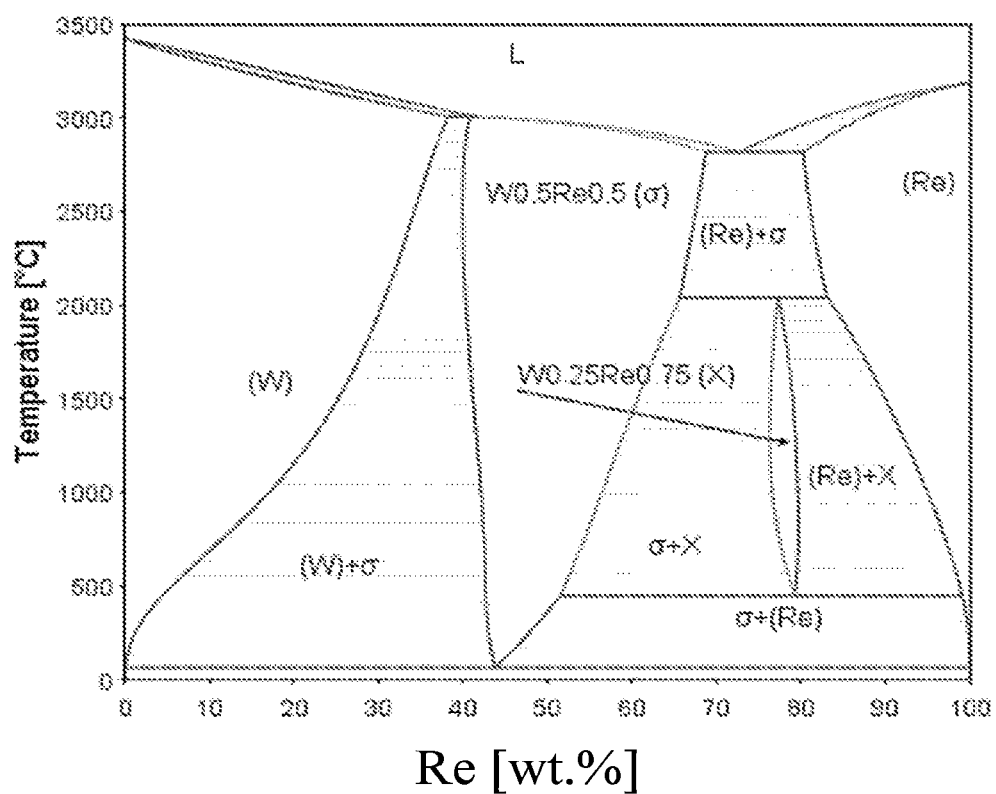
FIG. 1: a phase diagram of the binary tungsten-rhenium system.

A selection of results is summarized in Table 1, a more detailed representation is given in the graph of FIG. 1, where the thermal emissivity epsilon (c) is shown as a function of the rhenium content.

TABLE 1

Comparison of thermal emissivity for different coatings

| Sample | | Thermal emissivity ε | Observation |
|---|---|---|---|
| 1 | Tungsten slurry | 0.34 | Prior art |
| 2 | Rhenium slurry | 0.36 | Prior art |
| 3 | Tantalum nitride slurry | 0.89 | Prior art (WO2018204943), $T_{max}$ = 1500° C. |
| 4 | Rhenium (80%) + tungsten (20%) | 0.35 | Sintered only 6 hours |
| 5 | Rhenium (80%) + tungsten (20%) | 0.66 | 20 h sintered |

Sample No. 1, a porous tungsten coating obtained with 100% tungsten slurry has a thermal emissivity of 0.34. Sample No. 2, a porous rhenium coating obtained with 100% rhenium slurry has a thermal emissivity of 0.36. Sample No. 3 is a coating of tantalum nitride that was produced in accordance with the details in WO2018204943 of the applicant. This has a comparatively high thermal emissivity of 0.89, but it can only be used for temperatures up to a maximum of 1500° C. Sample No. 4 has a coating composed of 80% rhenium, 20% tungsten, which has been prepared as described above for comparison purposes with a heat treatment at 1600° C. for 6 hours. As explained in more detail below, this sample has primarily tungsten/rhenium solid solutions and only a very small fraction of $Re_3W$ phase. It has a thermal emissivity of 0.35. Sample No. 5 is an 80% rhenium and 20% tungsten coating prepared according to the instructions previously described (heat treatment at 1800° C. for 20 hours). The proportion of $Re_3W$ phase is ca. 90% by weight. The thermal emissivity was determined to be 0.66.

Figure 2A:
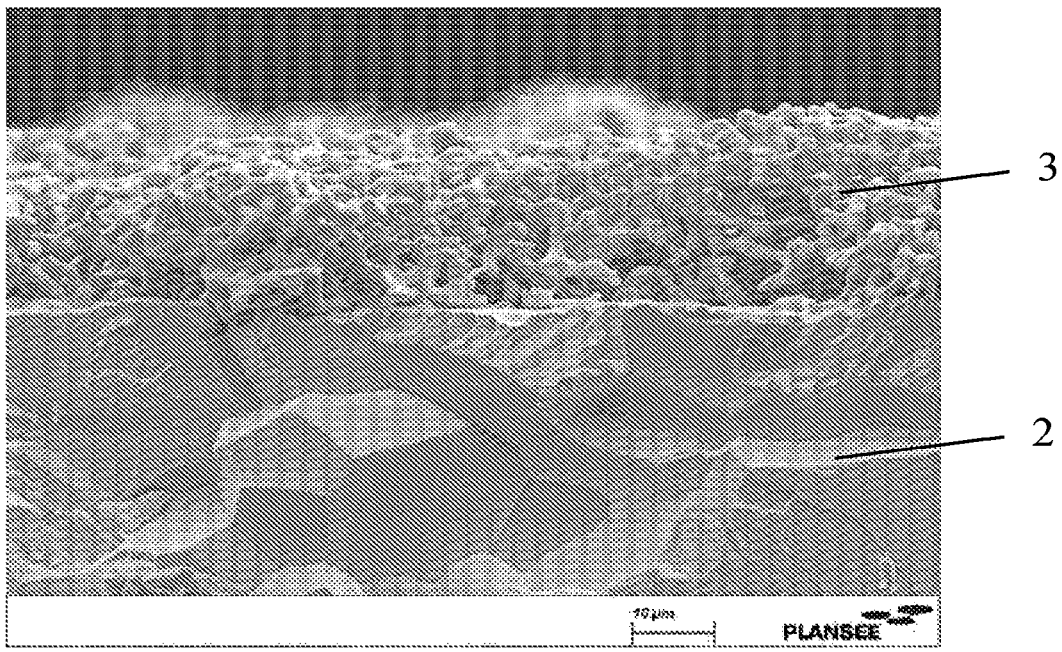
FIG. 2a-2d: scanning electron micrographs of surfaces coated according to the invention in cross section (fracture surfaces) (FIGS. 2a and 2c) and in top view (FIGS. 2b and 2d)
Figure 2B:
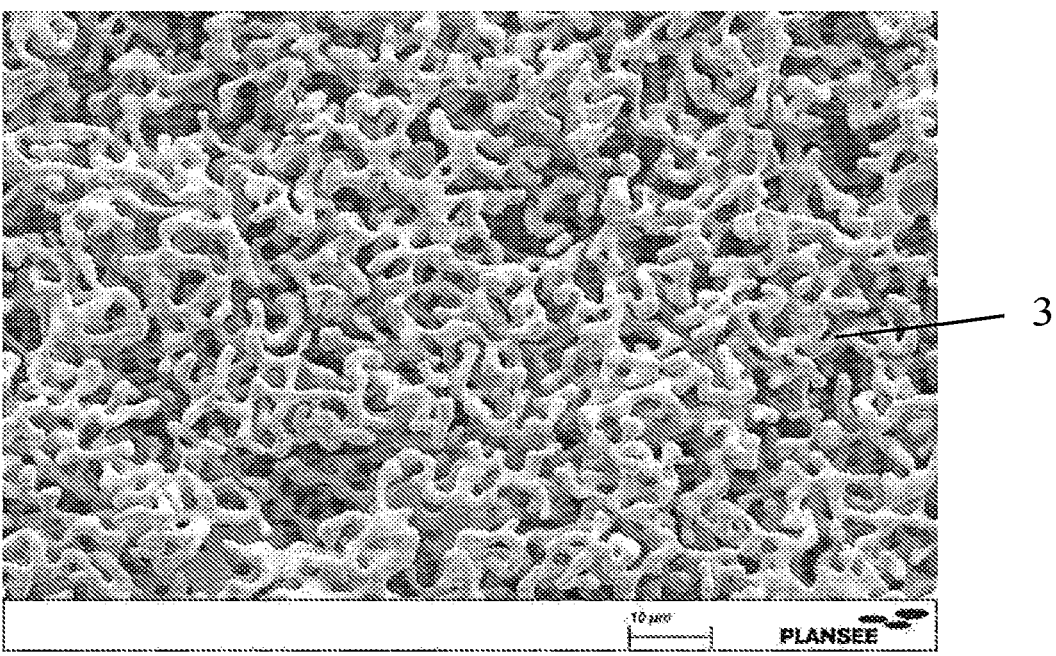
Figure 2C:
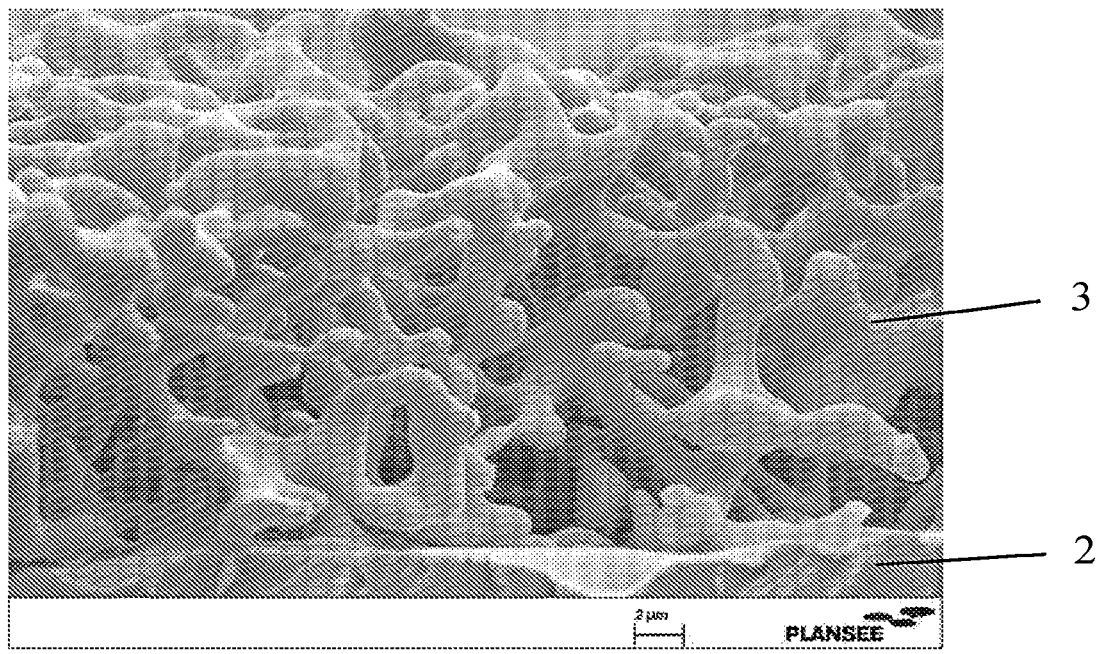
Figure 2D:
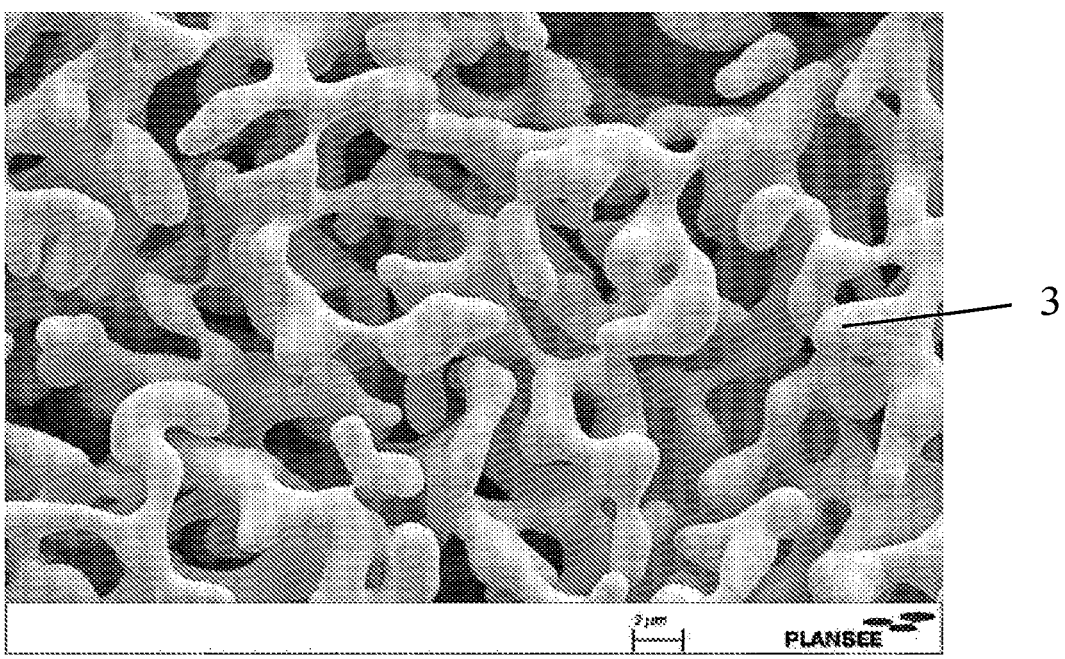

FIGS. 2a to 2d show scanning electron micrographs of Sample No. 5. FIGS. 2a and 2b are an image magnified 1000-fold, and FIGS. 2c and 2d show an image magnified 3000-fold. FIGS. 2a and 2c show a fracture surface normal to the surface of the sample, FIGS. 2b and 2d are a top view of the surface, i.e. the viewing direction is normal to the coated surface. In the fracture surfaces, the substrate 2 composed of tungsten sheet material can be seen in the lower part of the figure. The porous coating 3 can be seen above it. The porosity increases the microscopic surface area and contributes to a further increase in thermal emissivity.

Figure 3:
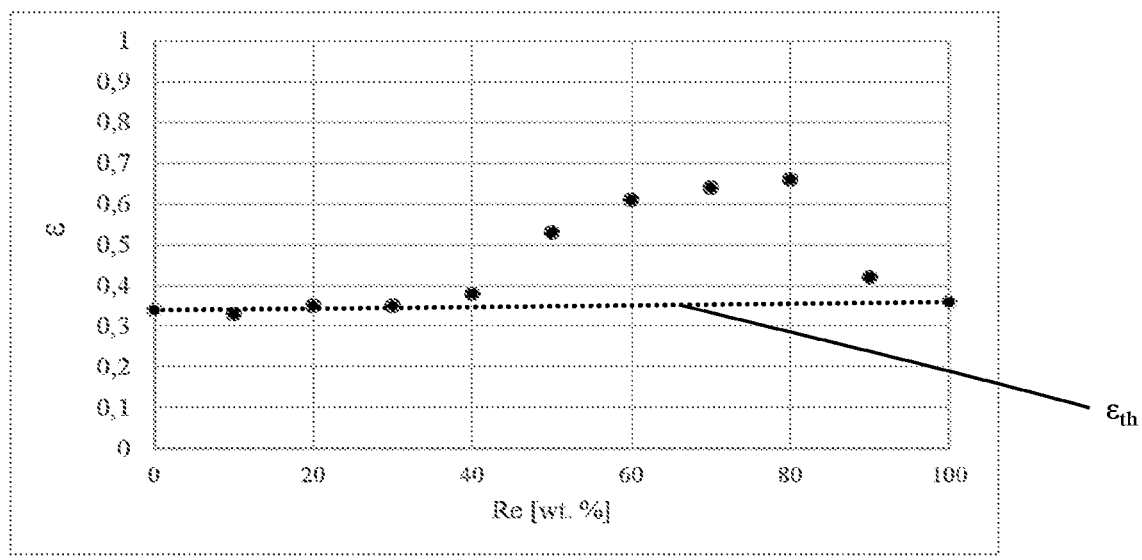
FIG. 3: a diagram with values for the thermal emissivity epsilon (c) for various coatings.

FIG. 3 shows, in a graph, the measured thermal emissivities epsilon (ε) for the test series mentioned at the outset having different rhenium contents. The rhenium content is plotted on the abscissa and the measured thermal emissivity epsilon (ε) is plotted on the ordinate. The points in the diagram denote the respective measurement values. The dashed line Eth (epsilon theoretical) marks the thermal emissivity values that would be expected when linearly interpolating the thermal emissivity from 100% by weight tungsten to 100% by weight rhenium. It can be seen that, particularly in the range between 50% by weight and 90% by weight rhenium, the measured values for the thermal emissivity surprisingly do not run along this straight line Eth but above it, sometimes very significantly above. There is a maximum value for the thermal emissivity in the range between 70 and 80% by weight rhenium. Measurements by the applicant indicate that the advantageous increase in the thermal emission value is likely to be due to the presence of the $Re_3W$ phase.

This is illustrated in Table 2. Table 2 shows the results of a detailed quantitative phase analysis for samples having a rhenium content of 70% by weight (sample I) and 80% by weight (sample II). For the quantitative determination of the phases, part of the coating of the respective sample was scraped off, ground to a powder and analyzed by XRD. For comparison, measured values for samples (sample Ia and sample IIa) that were produced in a conventional way (i.e. with a heat treatment duration of 6 hours) are also given.

TABLE 2

Phase analysis

| Sample | | Phase $W_{0.5}Re_{0.5}$ | Phase $Re_3W$ | Phase (Re) | Phase (W) | Thermal emissivity ε |
|---|---|---|---|---|---|---|
| I | Re 70 wt. %, W 30 wt. % | 10.5 | 89.5 | | | 0.64 |
| Ia | Re 70 wt. %, W 30 wt. % (6 h) | 59.9 | 21.8 | | 18.3 | 0.35 |
| II | Re 80 wt. %, W 20 wt. % | | 90.4 | 9.6 | | 0.66 |
| IIa | Re 80 wt. %, W 20 wt. % (6 h) | 57.1 | 27.8 | | 15.1 | 0.35 |

(W) and (Re) are both solid solution phases ((W) is a tungsten crystal with rhenium dissolved therein, analogously (Re) is a rhenium crystal with tungsten dissolved therein). $W_{0.5}Re_{0.5}$ is an intermetallic phase and is also shown in the phase diagram as σ-phase. The quantities in the phases are in % by weight.

The measurement results show that in the samples with the coating according to the invention, which have been heat-treated for a significantly longer time, the proportion of $Re_3W$ is significantly higher than in the samples produced with a heat treatment time typically used in powder metallurgical processing of tungsten and rhenium. The portion of the $Re_3W$ is around 90% by weight for both samples, sample I (70% by weight rhenium) and sample II (80% by weight rhenium), whereas the proportion of $Re_3W$ in the corresponding conventionally produced samples is 21.8% by weight (sample Ia) or 27.8% by weight (sample IIa). The high proportion of $Re_3W$ is also associated with a significantly higher thermal emission coefficient.

Figure 4A:
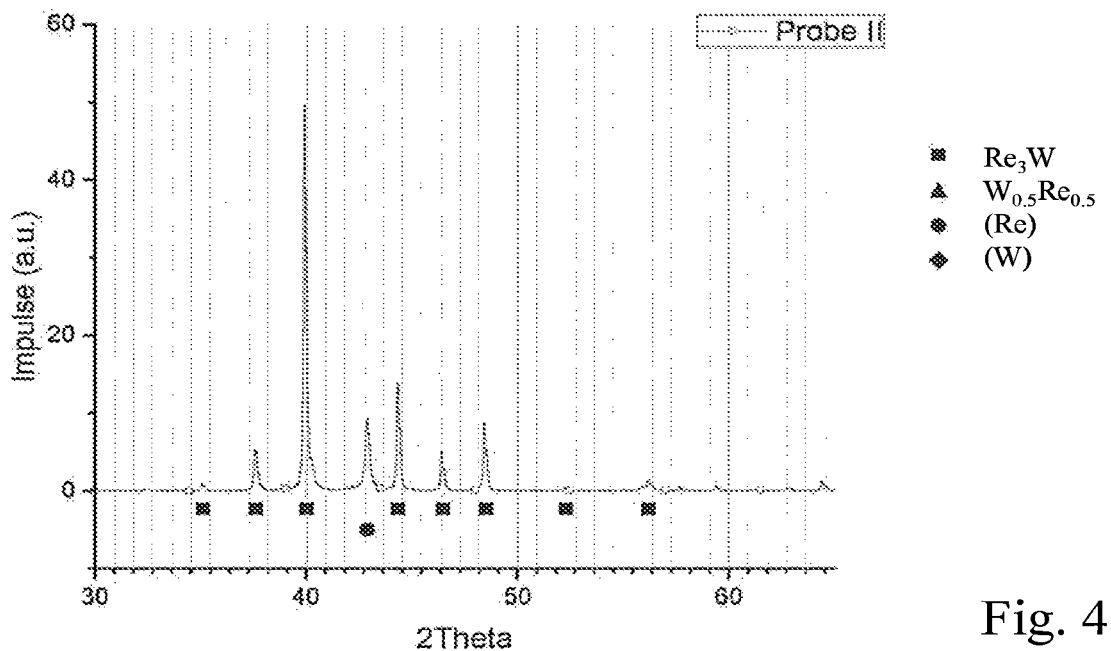
FIG. 4a, 4b: X-ray diffractograms (XRD) of a layer produced according to the invention and a conventionally produced layer.
Figure 4B:
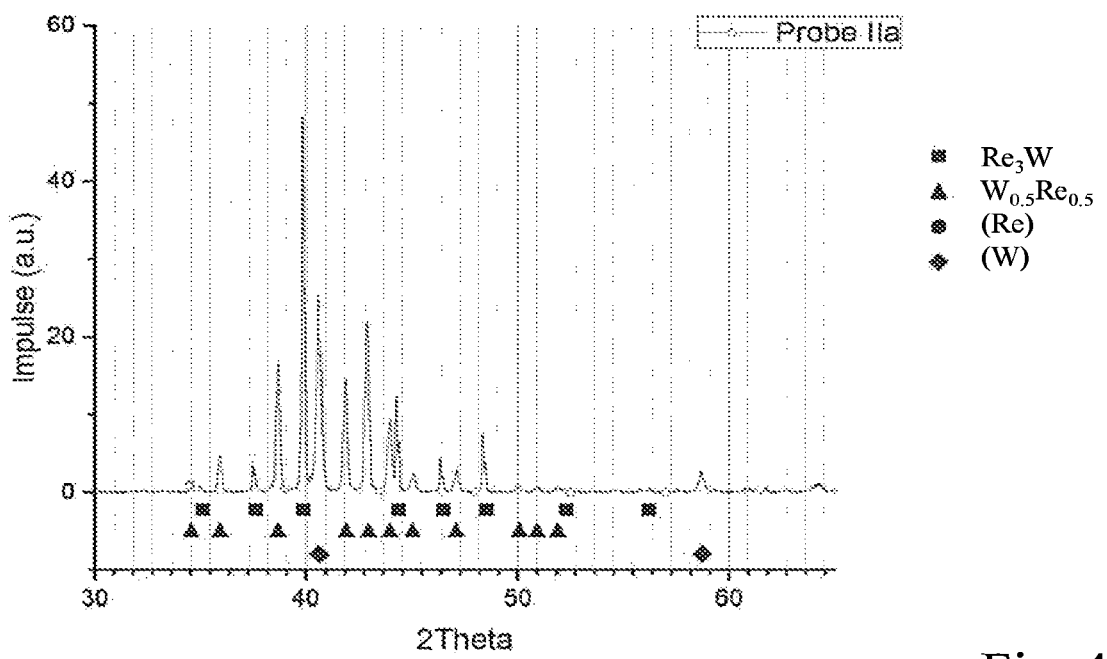

FIGS. 4a and 4b show X-ray diffractograms (XRD) of sample II (FIG. 4a) and sample IIa (FIG. 4b). In the diffractograms, intensity values are given as a function of the deflection angle 2Theta (range from 30 to 65 2Theta) and the measured reflections (peak values) are assigned to the phases present. In sample II with the coating according to the invention, the proportion of $Re_3W$ predominates.

Table 3 demonstrates the temperature resistance of the samples according to the invention. Shown is the measured value for the thermal emissivity as a function of the temperature at which the sample was subjected to a heat stress test. The samples were annealed at this temperature for the period of one hour.

TABLE 3

Temperature resistance

| Heat stress test (temperature) | Thermal emissivity ε |
|---|---|
| None | 0.66 |
| 2000 | 0.65 |
| 2200 | 0.58 |

The series of tests showed that the thermal emissivity at T=2000° C. does not decrease significantly (from 0.66, the value for the sample before the heat stress test, to 0.65) and the coating does not degrade. At T=2200° C., a decrease in thermal emissivity of ca. 12% was observed. The material withstands the high thermal stress, but the porous layer begins to sinter somewhat. Nevertheless, high thermal emissivity is maintained even at this high temperature. The coating according to the invention thus withstands exposures of 2000° C. and above and it can therefore be used for heating filaments in MOCVD systems.

Production Example II

An alternative variant for producing the coating is based on physical vapor deposition. In the production example, a tungsten platelet was first coated with a conventional 100% tungsten slurry layer. This serves to increase the surface area. A ca. 4 µm thick layer of $Re_3W$ phase was sputtered onto this layer using a target containing ca. 98% $Re_3W$ phase. The resulting layer had approximately 75% by weight rhenium. Since part of the radiation exchange also occurs via parts of the porous tungsten structure that are not covered by the PVD coating, the measured values for the thermal emissivity did not quite reach the values in production example I.

Application examples for the high-temperature component are explained below with reference to FIGS. 5 to 7.

Figure 5:
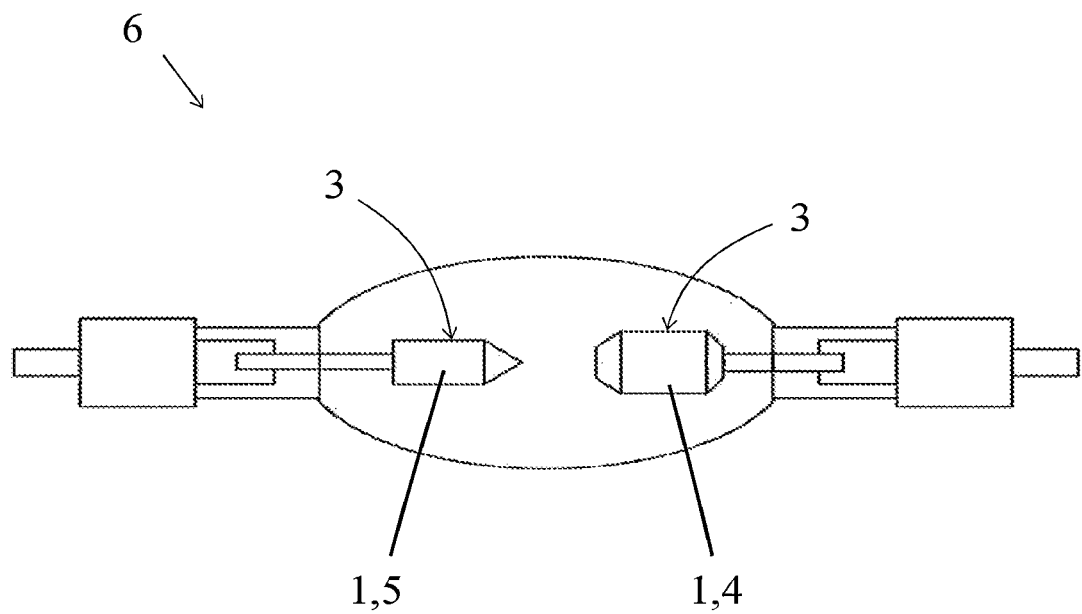
FIG. 5: schematically a high-pressure discharge lamp as an exemplary embodiment of a high-temperature component.

In FIG. 5, a high-pressure discharge lamp 6 is shown schematically. A discharge arc is formed between the electrodes—a cathode 5 and an anode 4—during operation. In the present exemplary embodiment, the anode 4 is the high-temperature component 1 and is provided with a coating 3 according to the invention. The coating 3 allows the anode 4 to emit a higher thermal radiation output, which reduces its temperature and increases the service life. Likewise, the cathode 5 or both the anode 4 and the cathode 5 can be provided with the coating 3. Clearly, the coating 3 according to the invention for increasing thermal emissivity can also be used for other types of lamps.

Figure 6:
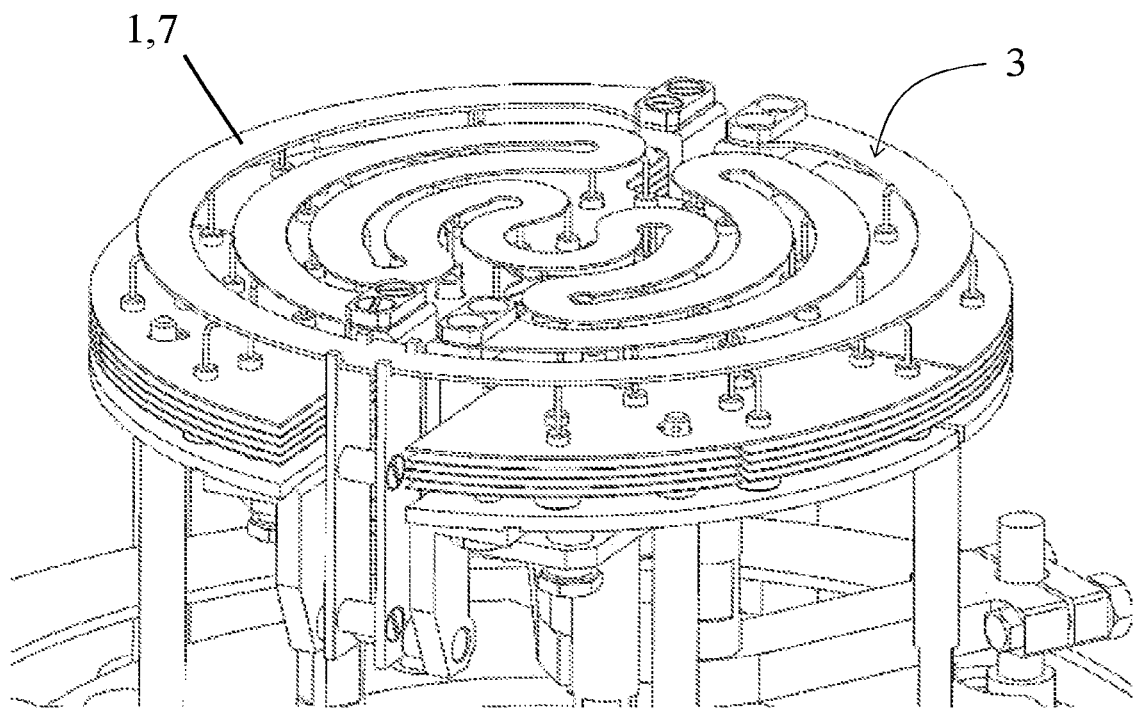
FIG. 6: a heating conductor as an exemplary embodiment of a high-temperature component.

FIG. 6 shows a heating conductor 7 of a refractory metal in an exemplary arrangement as a base heater of a high-temperature furnace. The heating conductor 7 is heated by passing a current directly through it and warms the interior of the high-temperature furnace by giving off radiant heat.

In the present exemplary embodiment, the heating conductor 7 forms the high-temperature component 1 and is provided with a coating 3 according to the invention for increasing thermal emissivity. When used on a heating conductor 7, the coating 3 allows said heating conductor 6 to produce a given heating output at a lower temperature. This reduces creep of the heating conductor 7 and extends the lifetime.

Figure 7:
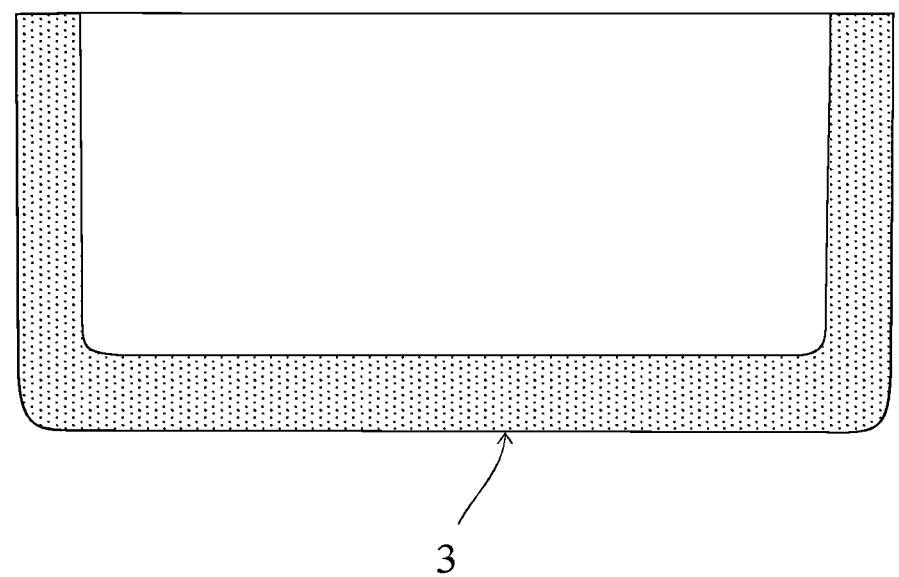
FIG. 7: a crucible as an exemplary embodiment of a high-temperature component.

FIG. 7 schematically shows a crucible 8 of refractory metal. Crucibles of refractory metal are used for example to melt aluminum oxide in the production of single-crystal sapphires. For this purpose, the crucibles are placed in a high-temperature furnace and warmed there by radiant heat from heating conductors. The heat transfer predominantly takes place via the lateral surface of the crucible, which absorbs the radiant heat and transmits it to the product to be melted. In the present exemplary embodiment, the crucible 8 forms the high-temperature component 1 and is provided with a coating 3 according to the invention for increasing thermal emissivity. When used on a crucible 8, the coating 3 brings about the effect that a greater proportion of the heat given off by heating conductors is coupled into the crucible 8. The crucible 8 thereby reacts more quickly to a heat input from heating conductors.

The use of the coating 3 is in no way limited to the examples shown here. The coating 3 is generally advantageous for high-temperature components, at which heat transfer by means of radiation is to take place.

LIST OF THE DESIGNATIONS USED

1 High-temperature component
2 Main body of the high-temperature component
3 Coating to increase thermal emissivity
4 Anode
5 Cathode
6 High-pressure discharge lamp
7 Heating conductor
8 Crucible

The invention claimed is:

1. A high-temperature component based on refractory metal or a refractory metal alloy, the high-temperature component comprising:
a coating for increasing thermal emissivity, said coating consisting essentially of tungsten and rhenium including at least 55% by weight of rhenium and at least 10% by weight of tungsten, and said coating having a Re3W phase, kinetically stabilized at room temperature, of at least 35% by weight, said coating having a thermal emissivity $\varepsilon > 0.6$ in a wavelength range between 1700-2500 nm.

2. The high-temperature component according to claim 1, wherein said coating is porous.

3. The high-temperature component according to claim 1, which further comprises a structured surface of the high-temperature component below said coating.

4. The high-temperature component according to claim 1, wherein said coating is formed as a sintered layer.

5. The high-temperature component according to claim 1, wherein said coating is formed as a PVD layer.

6. The high-temperature component according to claim 1, which further comprises a top side of the high-temperature component, said coating being formed on said top side.

7. The high-temperature component according to claim 1, wherein the high-temperature component is formed as an electrode of a high-pressure discharge lamp.

8. The high-temperature component according to claim 1, wherein the high-temperature component is formed as a heating conductor.

9. The high-temperature component according to claim 1, wherein the high-temperature component is formed as a crucible.

10. A process for producing a high-temperature component having a coating for increasing thermal emissivity, the process comprising steps of:
providing a main body of the high-temperature component;
i) coating the main body with tungsten and rhenium by physical vapor deposition using a target material including tungsten and rhenium, the target material including at least 35% by weight Re3W phase; or
ii) coating the main body with tungsten and rhenium by physical vapor deposition using a target material including tungsten and rhenium,
heat treating the coated main body at a heat treatment temperature of at least 500° C. in an inert or reducing atmosphere or high vacuum to form the Re3W phase, and
cooling the main body to room temperature at a cooling rate of greater than 20 K/min to kinetically stabilize the Re3W phase; or iii) coating the main body with a powder mixture containing rhenium and tungsten with a molar ratio of 25 at. % tungsten to 75 at. % rhenium by a powder metallurgical process,
heat treating the coated main body at a heat treatment temperature of at least 500° C. in an inert or reducing atmosphere or high vacuum to form the Re3W phase,
cooling the main body to room temperature at a cooling rate of greater than 20 K/min to kinetically stabilize the Re3W phase; and
providing the coating with a thermal emissivity $\varepsilon > 0.6$ in a wavelength range between 1700-2500 nm.

11. The process according to claim 10, which further comprises enlarging a surface area of the main body before coating the main body in step i) or ii).

12. The process according to claim 11, which further comprises enlarging a surface area of the main body of the high-temperature component in step i) or ii) by providing a slurry coating of the main body.

13. The process according to claim 11, which further comprises enlarging a surface area of the main body of the high-temperature component in step i) or ii) by mechanical, chemical or thermal structuring of the main body.

14. The process according to claim 10, which further comprises coating the main body by using a slurry process in step iii).

* * * * *